United States Patent
Saptharishi (10) Patent No.: US 11,276,765 B2
(45) Date of Patent: Mar. 15, 2022

(54) COMPOSITE-CHANNEL HIGH ELECTRON MOBILITY TRANSISTOR

(71) Applicant: Cree, Inc., Durham, NC (US)

(72) Inventor: Sriram Saptharishi, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 28 days.

(21) Appl. No.: 16/451,817

(22) Filed: Jun. 25, 2019

(65) Prior Publication Data

US 2020/0411663 A1  Dec. 31, 2020

(51) Int. Cl.
*H01L 29/778* (2006.01)
*H01L 29/66* (2006.01)

(52) U.S. Cl.
CPC .. *H01L 29/66462* (2013.01); *H01L 29/66431* (2013.01); *H01L 29/778* (2013.01)

(58) Field of Classification Search
CPC ......... H01L 29/66431; H01L 29/66462; H01L 29/778–7789
See application file for complete search history.

(56) References Cited

U.S. PATENT DOCUMENTS

| | | | | |
|---|---|---|---|---|
| 5,266,506 A * | 11/1993 | Green, Jr. | | H01L 29/778 148/DIG. 53 |
| 7,692,263 B2 * | 4/2010 | Wu | | H01L 29/2003 257/488 |
| 8,896,027 B2 * | 11/2014 | Terano | | H01L 29/205 257/194 |
| 9,035,355 B2 * | 5/2015 | Ostermaier | | H01L 29/41725 257/194 |
| 10,403,745 B2 * | 9/2019 | Higuchi | | H01L 29/78 |
| 2002/0017648 A1 * | 2/2002 | Kasahara | | H01L 21/28575 257/79 |
| 2005/0077538 A1 * | 4/2005 | Heikman | | H01L 29/66462 257/183 |
| 2008/0124851 A1 * | 5/2008 | Zhang | | H01L 29/66462 438/172 |
| 2014/0264273 A1 * | 9/2014 | Howell | | H01L 29/1037 257/20 |
| 2016/0013327 A1 * | 1/2016 | Terano | | H01L 29/36 257/76 |
| 2019/0006501 A1 * | 1/2019 | Yang | | H01L 29/7783 |

OTHER PUBLICATIONS

Bajaj, Sanyam, et al., "Density-dependent electron transport and precise modeling of GaN high electron mobility transistors", Applied Physics Letters 107, 153504 (2015).

* cited by examiner

*Primary Examiner* — Eric A. Ward
(74) *Attorney, Agent, or Firm* — Coats & Bennett, PLLC (57) ABSTRACT

A HEMT comprises a composite channel, made up of a plurality of channel/barrier layer heterojunctions. That is, two or more channel/barrier layer pairs are deposited on a substrate, under a gate contact. A separate 2DEG is formed in each channel layer at the heterojunction with the barrier layer. The HEMT channel is effectively divided among a plurality of parallel 2DEGs. A high total charge density—required for high power operation—is divided among the plurality of 2DEGs. Since each 2DEG does not have a large charge density, it can sustain the high saturated electron velocity required for very high frequency operation. The composite-channel HEMT thus operates with high gain, at high power levels, and at high frequencies.

36 Claims, 5 Drawing Sheets

COMPOSITE-CHANNEL HIGH ELECTRON MOBILITY TRANSISTOR

FIELD OF INVENTION

The present invention relates generally to high frequency solid state transistors, and in particular to a Group-III nitride based High Electron Mobility Transistor (HEMT) having a composite channel structure.

BACKGROUND

A High Electron Mobility Transistor (HEMT) is a type of Field Effect Transistor (FET) having a low noise figure at microwave frequencies. HEMTs are used in Radio Frequency (RF) circuits, as both digital switches and current amplifiers, where high performance is required at very high frequencies. HEMTs employ a heterojunction—a junction between materials with different band gaps. HEMTs have been fabricated with several materials, including Silicon (Si); Gallium Arsenide (GaAs) and Aluminum Gallium Arsenide (AlGaAs); and Gallium Nitride (GaN) and Aluminum Gallium Nitride (AlGaN).

Si has a relatively low electron mobility (e.g., 1450 cm$^2$N-s). This produces a high source resistance, which limits the HEMT gain. GaAs has a higher electron mobility (e.g., 6000 cm$^2$/V-s), and hence lower source resistance, allowing for higher gain at high frequencies. However, GaAs has a bandgap of only 1.42 eV at room temperature, and a small breakdown voltage, which limits high power performance at high frequencies.

Group III nitrides have a larger bandgap as compared to these other semiconductor materials and are thereby suitable for higher power and higher frequency applications. While GaN is of particular interest, in general, a Group III nitride heterojunction for a HEMT may be formed from a binary, ternary, or quaternary alloy of Group III metals and Nitrogen. This formulation may be expressed as $Al_xIn_yGa_{1-x-y}N$, where $0<=x<=1$ and $0<=y<=1$—that is, any combination of some or all of Aluminum, Indium, and Gallium alloyed with Nitrogen. In particular, the density of the various alloys may be altered to control the properties of the semiconductor. For example, Aluminum increases the bandgap of GaN, while Indium reduces it.

As one particular example, GaN has a bandgap of 3.36 eV and a relatively high electron mobility (e.g., 2019 cm$^2$/V-s). GaN HEMTs thus offer high power and high temperature operation at high frequencies, making them well suited for applications in wireless telecommunications, RADAR, and defense. In a GaN HEMT, a heterojunction is formed at the boundary of layers of GaN and, e.g., AlGaN. As used herein, AlGaN is an abbreviation for the formula $AlxGa_{1-x}N$, $0 \le x < 1$, meaning the concentration of Al in the alloy may be varied. Layers of AlGaN may also be graded, with the concentration of Al atoms in the lattice varying as a function of depth.

At the heterojunction between GaN and AlGaN layers, the difference in bandgap energies between the higher bandgap AlGaN and the GaN creates a two-dimensional electron gas (2DEG) in the smaller bandgap GaN, which has a higher electron affinity. The 2DEG has a very high electron concentration. Additionally, the Al content in the AlGaN layer creates a piezoelectric charge at the interface, transferring electrons to the 2DEG in the GaN layer, enabling a high electron mobility. For example, sheet densities in the 2DEG of a AlGaN/GaN HEMT can exceed $10^{13}$ cm$^{-2}$. The high carrier concentration and high electron mobility in the 2DEG create a large transconductance, yielding high performance for the HEMT at high frequencies.

Figure 1:
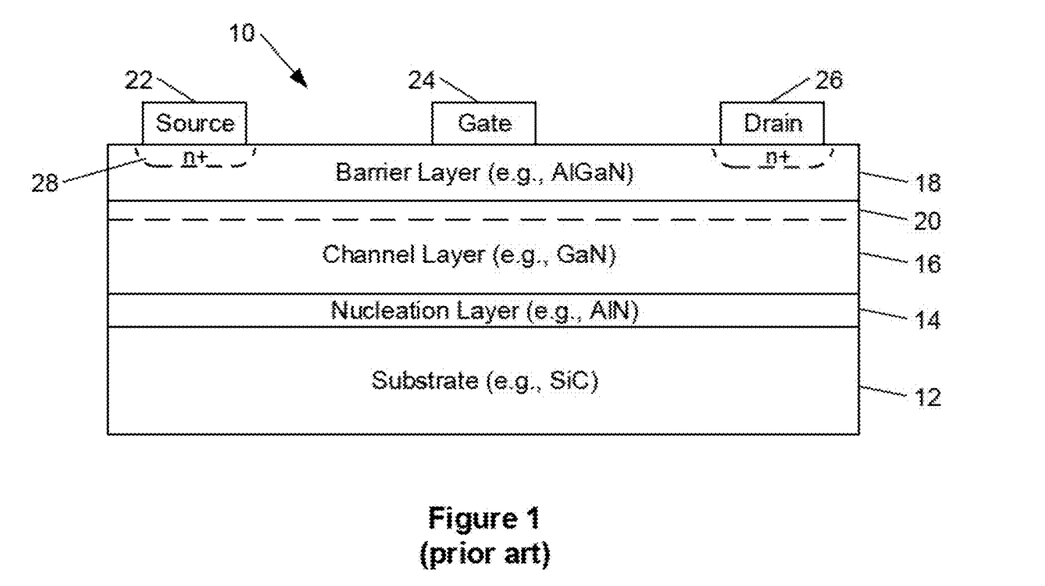
FIG. 1 is a section diagram of a known HEMT.

FIG. 1 depicts one embodiment of a conventional GaN HEMT 10. The GaN HEMT 10 includes a substrate 12, formed for example from Silicon Carbide (SiC). An optional Nucleation Layer 14 may be deposited over the substrate, for example formed from Aluminum Nitrate (AlN). A Channel Layer 16 of GaN is deposited over the Nucleation Layer 14 (or alternatively directly on the substrate 12). A Barrier Layer 18 is deposited directly on the Channel Layer 16. The Barrier Layer 18 may comprise, e.g., AlGaN. At the boundary of the Channel Layer 16 and Barrier Layer 18, or the heterojunction, a 2DEG 20 is formed. The 2DEG provides a channel for conduction between a Source Terminal 22 and Drain Terminal 26, in dependence on the voltage on a Gate Terminal 24. Implant regions 28 are doped with an n-type material, to facilitate electric connectivity between the Source 22 and Drain 26 Terminals and the 2DEG 20, or the HEMT 10 channel.

Figure 2:
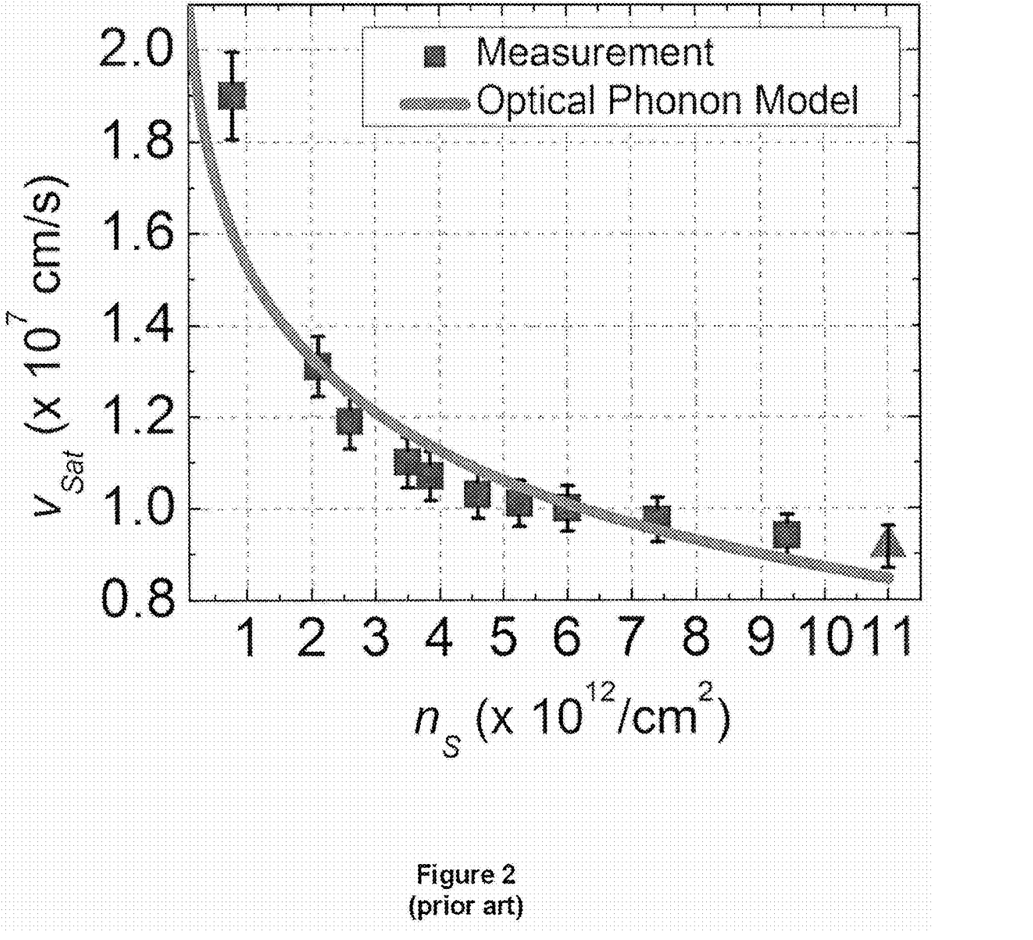
FIG. 2 is a graph showing the inverse relationship between saturated electron velocity and charge density.

An important property, which limits achievable RF performance, is saturated electron velocity in the 2DEG in the GaN at the heterojunction. However, research has shown that saturated electron velocity ($v_{sat}$) is inversely related to sheet charge density ($n_s$). See Sanyam Bajaj, et al., Density-Dependent Electron Transport and Precise Modeling of GaN HEMTs, Applied Physics Letters, 107(15), August 2015. FIG. 6 of this paper is reproduced as FIG. 2, which plots a theoretical $v_{sat}$ vs. $n_s$ curve against measured results.

In some applications, a charge density of about 1E13/cm$^2$ is required to obtain power density in the 10 W/mm range. However, as FIG. 1 shows, the electron velocity is significantly reduced at this high charge density, which compromises high frequency performance. Obtaining both high electron velocity and high charge density, which would yield both high power density and high gain, stands as a major challenge in the design of HEMTs.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a HEMT comprises a composite channel, made up of a plurality of channel/barrier layer heterojunctions. That is, two or more channel/barrier layer pairs are deposited on a substrate, under a gate contact. A separate 2DEG is formed in each channel layer, forming a constituent HEMT channel. Conductive regions are formed beneath source and drain contacts, which extend into all of the constituent channels. The HEMT composite channel is thus effectively divided among a plurality of parallel 2DEGs. A high total charge density—required for high power operation—is divided among the plurality of 2DEGs. Since each 2DEG does not have a large charge density, it can sustain the high saturated electron velocity required for very high frequency operation. The composite-channel HEMT thus operates with high gain, at high power levels, and at high frequencies. The composite-channel HEMT is preferably formed from Group III Nitrides, i.e., $Al_xIn_yGa_{1-x-y}N$, where $0<=x<=1$ and $0<=y<=1$. As specific example, the channel layers may comprise GaN, GaAs, or other suitable material. The barrier layers may comprise, for example, AlGaN, AlInGaN, AlN, or other suitable materials.

One embodiment relates to a composite channel transistor. The transistor includes a first channel layer; a first barrier layer directly on the first channel layer, the first barrier layer having a higher bandgap than the first channel layer; and a first Two-Dimensional Electron Gas (2DEG) formed in the first channel layer at an interface with the first barrier layer. The HEMT further includes a second channel layer on the first barrier layer; a second barrier layer directly on the second channel layer, the second barrier layer having a higher bandgap than the second channel layer; and a second Two-Dimensional Electron Gas (2DEG) formed in the second channel layer at an interface with the second barrier layer.

Another embodiment relates to a method of fabricating a transistor. A first channel layer is deposited. A first barrier layer is deposited directly on the first channel layer, the first barrier layer having a higher bandgap than the first channel layer, whereby a first Two-Dimensional Electron Gas (2DEG) is formed in the first channel layer at an interface with the first barrier layer. A second channel layer is deposited on the first barrier layer. A second barrier layer is deposited directly on the second channel layer, the second barrier layer having a higher bandgap than the second channel layer, whereby a second 2DEG is formed in the second channel layer at an interface with the second barrier layer.

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Furthermore, the various layers and regions illustrated in the figures are illustrated schematically. Accordingly, embodiments of the present invention are not limited to the relative size, spacing, and alignment illustrated in the accompanying figures. As used herein, a semiconductor layer described as being "on" a substrate or other layer may refer to the layer formed directly on the substrate or other layer, or on an intervening layer or layers formed on the substrate or other layer. As used herein, a semiconductor layer described as being "directly on" another layer means the two layers share an interface—that is, there is no intervening layer between the two. As used herein, references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In order to provide desired semiconductor properties, it is frequently desirable to dope a semiconductor layer with impurity atoms (i.e. dopants). Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards a target layer, where they become implanted. The number of ions directed at a target layer is referred to as the dose, which is typically expressed in ions/cm2. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth (i.e., the "implant range").

Ion implantation is useful for selective doping of crystalline material in order to form desired regions in the material, such as p-n junctions, highly conductive contact regions, field spreading regions, etc. Typically, after impurities are implanted into a semiconductor layer, it is desirable to anneal the implanted impurities at a high temperature, i.e. a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

Figure 3:
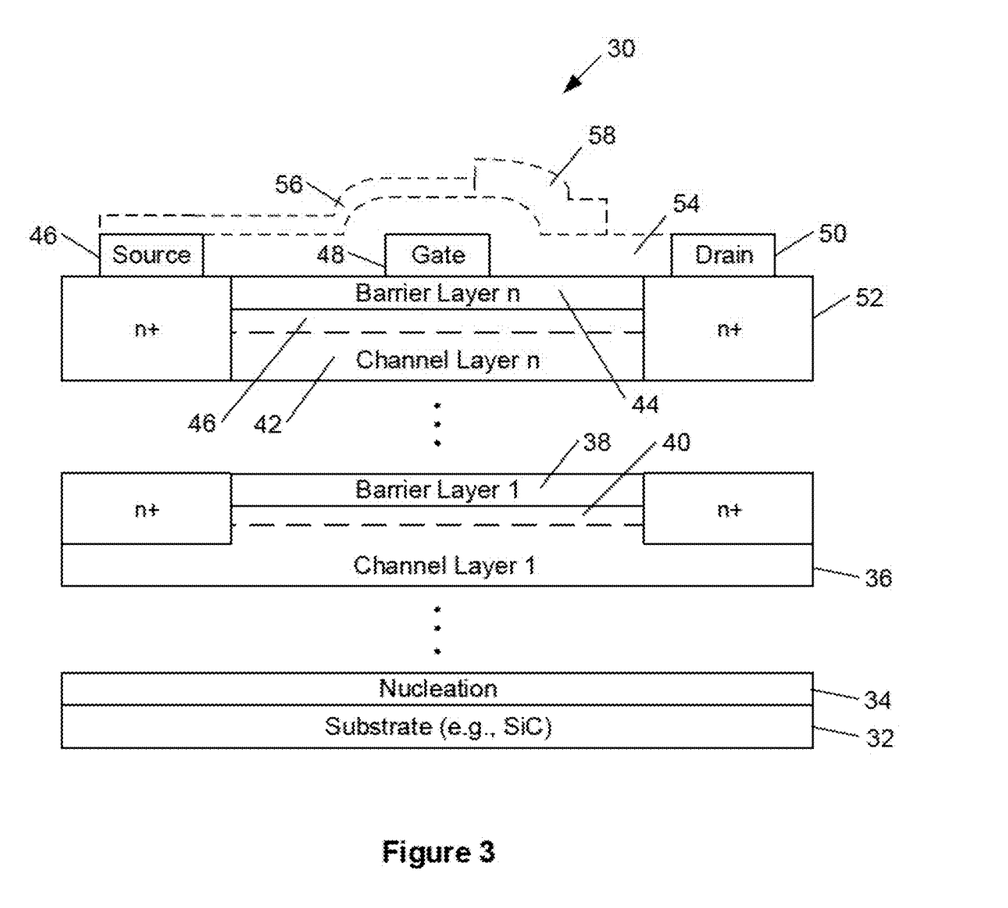
FIG. 3 is a section diagram of a generalized HEMT with a composite channel comprising n constituent channels.

FIG. 3 is a section view representing the structure of a generalized, composite-channel HEMT 30, according to one embodiment. The composite-channel HEMT 30 comprises a substrate 32, and optional nucleation layer 34. The composite-channel HEMT 30 includes a plurality of channel/barrier layer pairs, each providing a separate constituent 2DEG channel for the composite-channel HEMT 30. Although FIG. 3 depicts two such channel/barrier layer pairs, in general, as indicated by the ellipses, there could be any number of such pairs, providing any number of constituent channels.

The substrate 32 may be formed, for example, from sapphire ($Al_2O_3$), silicon carbide (SiC), gallium nitride (GaN), silicon (Si), or other suitable material. Silicon carbide has a closer crystal lattice match to Group III nitrides than sapphire, and results in Group III nitride films of higher quality. Silicon carbide also has a very high thermal conductivity so that the total output power of Group III nitride devices on a silicon carbide substrate is not limited by the thermal dissipation of the substrate. Also, the availability of silicon carbide substrates provides the capacity for device isolation and reduced parasitic capacitance that make commercial devices possible. Silicon carbide substrates are available from Cree, Inc., of Durham, N.C. and methods for producing them are set forth in the scientific literature as well as in a U.S. Pat. Nos. Re. 34,861; 4,946,547; 5,200,022; and 6,218,680.

A nucleation layer 34 may optionally be included on the substrate 32, to reduce the lattice mismatch between SiC in the substrate 12 and the first channel layer. The nucleation, channel, and barrier layers in the composite-channel HEMT 30 of FIG. 3 are preferably formed of Group III nitrides. Group III nitrides refer to semiconductor alloys formed between nitrogen and elements in the conventional Group III of the periodic table (group 13 under International Union of Pure and Applied Chemistry, IUPAC, naming convention)—such as aluminum (Al), Gallium (Ga), and Indium (In). A general formula that encompasses binary, ternary, and quaternary Group III nitride alloys is $Al_xIn_yGa_{1-x-y}N$, where $0<=x<=1$ and $0<=y<=1$.

In one embodiment, the nucleation layer may be formed from AlN, and may be up to about 1000 Å thick. The nucleation layer 22 can be formed using any known method, such as Metal Organic Chemical Vapor Deposition (MOCVD), Hydride Vapor Phase Epitaxy (HVPE), or Molecular Beam Epitaxy (MBE). Methods of depositing a nucleation layer 22 on a silicon carbide substrate are set forth in U.S. Pat. Nos. 5,393,993; 5,523,589; and 5,739,554.

A first channel/barrier layer pair is deposited over the nucleation layer 34, or if it is not present, over the substrate 32. The first channel/barrier layer pair comprises a channel layer 36 and barrier layer 38, forming a 2DEG 40 at the heterojunction thereof. In one embodiment, the channel layer 36 comprises GaN, and is in the range of 0.5-20 nm thick. The first channel layer 36 can be fabricated by the same methods as the nucleation layer 34. Techniques for epitaxial growth of Group III nitrides have been described in, for example, U.S. Pat. Nos. 5,210,051; 5,393,993; and 5,523,589.

A barrier layer 38 is deposited directly on the channel layer 36, forming a heterojunction at their interface. In one embodiment, the barrier layer 38 comprises AlGaN. In one embodiment, the barrier layer 38 has a thickness of about 10 Å to about 100 Å. The difference in bandgaps between the (larger bandgap) material in the barrier layer 38 and the (smaller bandgap) material in the first channel layer 36, as well as the greater electron affinity of the channel layer 36 material, cause a 2DEG 40 to form in the channel layer 36, at the heterojunction. This 2DEG 40 forms one constituent channel of the composite channel of the HEMT 30. Additionally, one or more alloyed elements (e.g., Al) in the barrier layer 38 create a piezoelectric charge that drives electrons into the 2DEG 40, increasing its carrier density and mobility, thus increasing the transconductance of the composite-channel HEMT 30. As discussed further herein, in one embodiment the barrier layer 38 is doped with an n-type dopant (e.g., Si), and the alloy concentration can be graded along its thickness.

Zero, one or more additional embedded channel/barrier layer pairs may be deposited over the barrier layer 38, each forming a constituent channel to the composite-channel HEMT 30. Finally, an uppermost channel/barrier layer pair is formed over the barrier layer of the uppermost embedded channel/barrier layer pair. The uppermost channel/barrier layer pair comprises a channel layer 42 and barrier layer 44, forming a 2DEG 46 at their heterojunction, as describe above for the first channel/barrier layer pair.

In one embodiment, the channel layer 42 comprises GaN, and is substantially similar to the channel layer 36 in composition, thickness, doping, and the like. However, in other embodiments, the channel layer 42 may have a different thickness or composition. The channel layer 42 can be deposited using the same techniques discussed earlier.

The barrier layer 44 is deposited directly on the channel layer 42, forming a heterojunction. In one embodiment, the barrier layer 44 comprises AlGaN, and is substantially similar to the barrier layer 38. However, in another embodiment, although the barrier layer 44 is also doped with an n-type dopant, the doping concentration is lower than in the barrier layer 38. As a result of the mechanisms described earlier, the barrier layer 44 forms a 2DEG 46 in the channel layer 42 at the heterojunction. This 2DEG 46 forms an additional constituent channel of the composite channel of the HEMT 30, with the charge density in each of the 2DEG 46 and the 2DEG 40 (as well as the 2DEGs of any additional constituent channels) contributing to the total charge density of the HEMT 30, which is required for high gain and high power operation. However, since the large, combined charge density does not collect solely in either the 2DEG 46 or the 2DEG 40, it does not impede the saturated electron velocity in these regions, allowing for good performance at very high frequencies.

In the uppermost channel/barrier layer pair—that is, the channel layer 42 and barrier layer 44, forming the 2DEG 46—similarly to a conventional HEMT 10, positive charge from a metal terminal such as the gate terminal 48 or a passivation layer 54 accumulates on the upper surface of the barrier layer 44. This causes a negative charge within the 2DEG region 46 of the channel layer 42, adding to the charge density and electron mobility. This effect does not occur for lower, embedded channel/barrier layer pairs, such as channel layer 36 and barrier layer 38, forming 2DEG 40, as there is no positive charge accumulated at the upper surface of the barrier layer 38. Accordingly, in one embodiment, all embedded barrier layers are doped with an n-type dopant to a greater extent than is the uppermost barrier layer 44, to achieve a separation of charge across the barrier layer. In some embodiments, the n-type dopant is silicon. In some embodiments, the uppermost barrier layer 44 may not be doped at all.

In one embodiment, the doping of the lower barrier layer(s) 38 is controlled so as to concentrate the n-type dopant proximate the upper surfaces of the barrier layer 38. Since n-type dopants are electron donors, they release electrons into the conduction band. Due to the gradient in the conduction band produced by strain in the AlGaN layer, the released electrons accumulate in the upper region of the corresponding embedded channel layer 36, thus contributing to the formation of the 2DEG 40 at the heterojunctions. By confining the doped region to a thin layer at the very upper region of the embedded barrier layer 38, the dopant does not interfere with the migration of electrons into the underlying channel layer 36. A similar doping strategy may be applied to all embedded barrier layers.

Si and Ge are common n-type dopants, although other n-type dopants or combinations of dopants are possible. The doping can be in the range of 1 to 4E12 $cm^2$. The doping density (per $cm^2$) is more important than the exact thickness of the doped layer. In one embodiment, the doping is confined to a very thin layer, about 1 to 2 nm in thickness. In one embodiment, the doping of embedded barrier layers 38 is graded from approximately 0% at their lower surfaces, towards an alloy concentration of about 22% at their upper surfaces. Different embedded barrier layers 38 may have the same, or differing, doping gradient profiles.

A source terminal 46, gate terminal 48, and drain terminal 50 are deposited over the barrier layer 44, to provide connectivity to other circuits. The source 46, gate 48, and drain 50 terminals are preferably metal, which may be deposited e.g. by evaporation. Suitable metals include Ti, Si, ZSi, Ni, Au, Al, Ta, Mo, TiN, WSiN, Pd, and Pt. The contacts for each of the source, gate and drain can be of the same or different metal layers. Methods of forming ohmic contacts on doped Group III nitride semiconductor devices are set forth in U.S. Pat. Nos. 9,318,594 and 9,548,206.

To provide conductivity for the source terminal 46 and drain terminal 50 to reach each constituent channel of the composite-channel HEMT 30, conductive regions 52 are formed, which reach as deeply into the HEMT 30 as required to reach all constituent channels. The conductive regions 52 may be formed as regions of n+ implants. Impurity ions of, e.g., silicon, sulfur, or oxygen are implanted into the HMT 30 structure such that at least a portion of the implanted ions come to rest within the layers 36, 38, 42, 44, as well as any intervening channel/barrier layer pairs. The ion implantation process may be controlled such that the implanted ions form a concentration profile having one or more peaks at desired points in the HEMT 30 structure. The implant process may include multiple implant steps to provide a net profile of implanted dopants. For example, the implant process may include a first implant step performed under a first set of implant conditions and a subsequent implant step performed under a second set of implant conditions. More than two implant steps may be performed. In some embodiments, the implants may be performed at room temperature. The implant energies and dose may be selected to provide an implant profile that achieves a desired sheet resistivity and/or permits fabrication of low resistivity ohmic contacts to the constituent channels.

After formation of the implanted regions 52, the implants may be activated by an activation anneal. The activation anneal may be performed in an inert atmosphere including, for example, N2 and/or Ar. The activation anneal may be performed at a temperature sufficient to activate the implanted dopant ions but less than a temperature at which any semiconductor layer 36, 38, 42, 44 deteriorates. In some embodiments, the activation anneal may be performed at a temperature of about 1000° C. to about 1300° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes. Methods of doping GaN are set forth in U.S. Pat. No. 9,318,594.

The conductive regions 52 can also be formed in other ways, such as doping during epitaxial growth if those areas are exposed via etching and regrown to the appropriate dopants during epitaxial growth. Si and Ge are common n-type dopants. Preferably, the doping concentration is as high as possible without introducing crystal defects. For example, in one embodiment, 1e18 to 1e20/$cm^3$ is the desired range of doping concentration. In one embodiment, the doping density is as high as possible near the top surface, to enable formation of good ohmic contact to the source and drain terminals 46, 50.

FIG. 3 also depicts a passivation layer 54 formed over the HEMT 30 upper surface, with field plates 56, 58 formed over the passivation layer 54. In particular, the field plate 56 overlies a significant portion of the HEMT 30, and is electrically connected to the source terminal 46. Filed plate 58 at least partially overlies, but is insulated from, the gate terminal 48, and overlies the gate-drain region of the HEMT 30.

Field plates are a known technique to improve the performance of Field Effect Transistor (FET) devices under high electric field operation. Field plates address the large electric field that arises in the gate-drain access region during normal operation of the FET. Devices operating with high electric fields have been known to suffer breakdown voltages, trapping effects, reduced reliability—all of which are at least partially alleviated by field plates.

Field plating relies on the vertical depletion of the FET device active region, which enables larger extensions of the horizontal depletion region. This results in a lower electric field in the device active region for a given bias voltage, alleviating at least some of the detrimental effects of operating the FET device at a high electric field. Additionally, a field plate positioned in the gate drain access region has the additional capability of modulating the device active region. This decreases surface traps effects, which impair FET device operation under large RF signals. Methods of fabricating field plates on FET devices, and in particular on Group III nitride HEMT devices, are described in U.S. Pat. No. 7,812,369.

U.S. Pat. No. 7,812,369 describes the formation of a field plate, similar to field plate 58, isolated from the (uppermost) barrier layer 44 of a Group III nitride HEMT, at least partially overlaying the gate terminal 48, and extending over some (but less than all) of the distance from the gate terminal 48 to the drain terminal 50. The field plate is electrically connected to the source terminal 46. This arrangement reduces the peak electric field in the HEMT device, resulting in increased breakdown voltage and reduced trapping, reduced leakage current, and enhanced reliability. Furthermore, the shielding effect of a source-connected field plate 58 reduces the gate-to-drain capacitance $C_{gd}$, which enhances input-output isolation.

Figure 4:
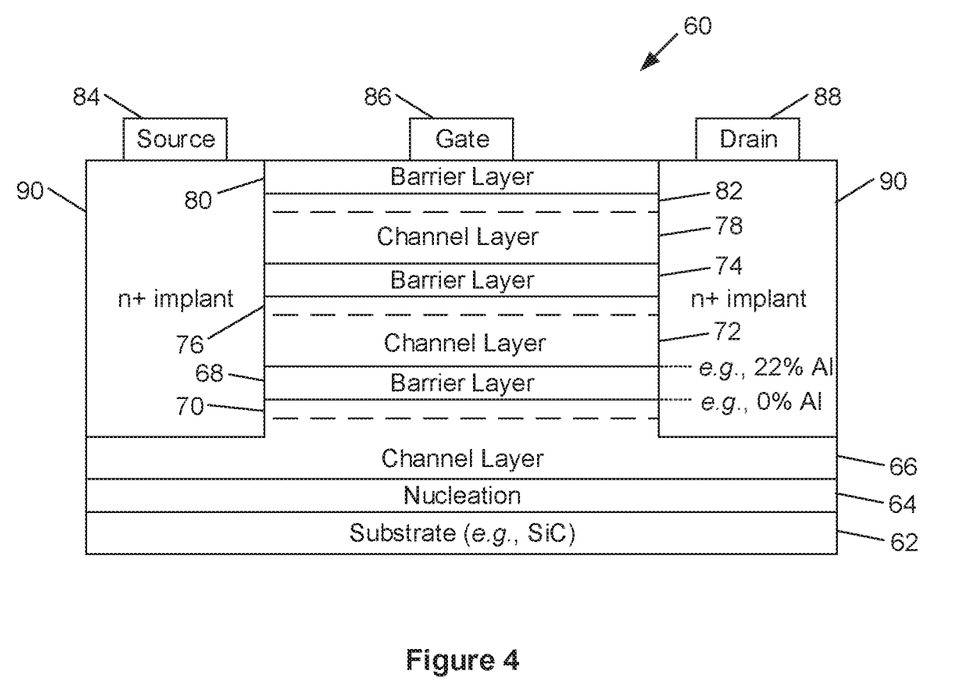
FIG. 4 is a section diagram of a particular embodiment of a HEMT with a composite channel comprising three constituent channels.
Figure 5:
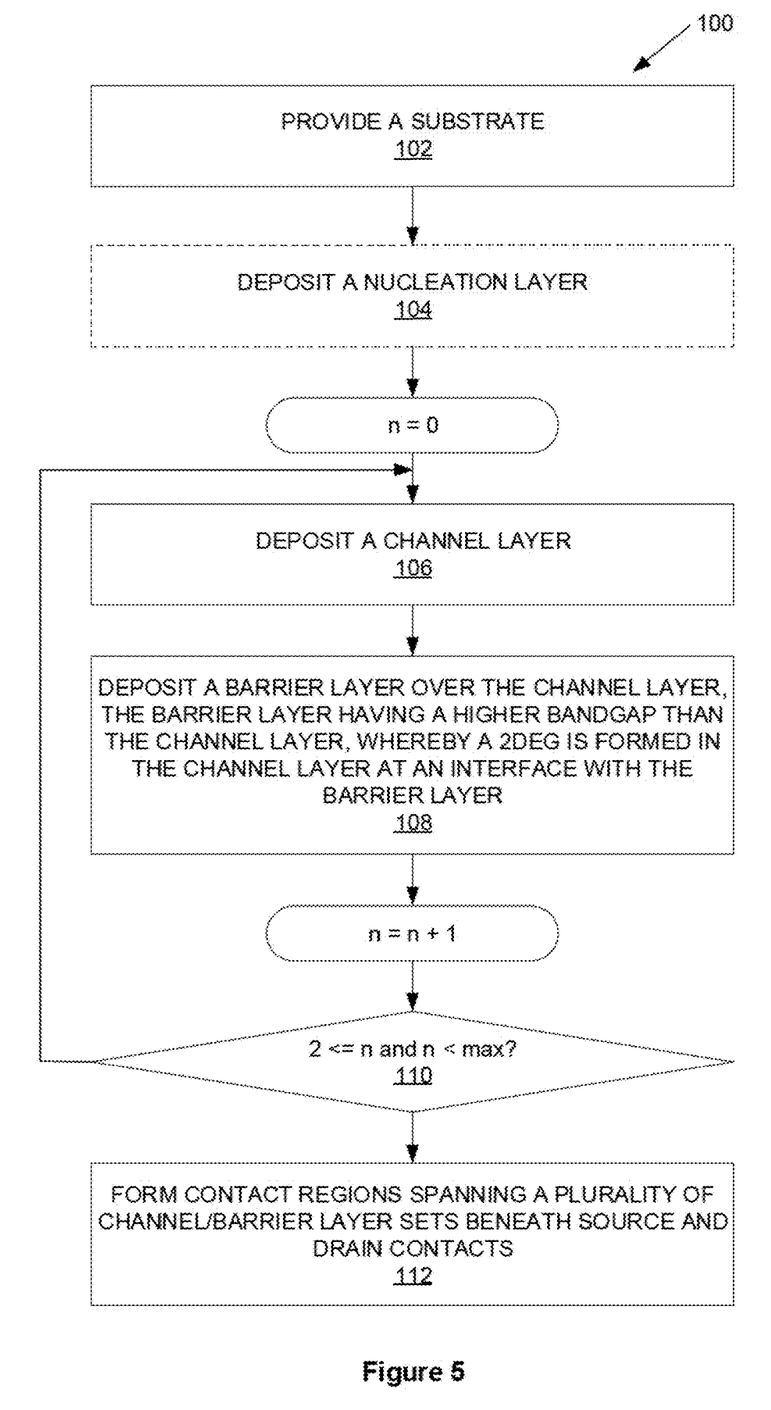
FIG. 5 is a flow diagram of a method of fabricating a HEMT with a composite channel.

FIG. 3 presents a general case, where any number of constituent channels may be formed in a composite-channel HEMT 30. FIG. 4 depicts a specific example, where three such channels are formed. The composite-channel HEMT 60 of FIG. 4 comprises a substrate 62, on which a nucleation layer 64 may optionally be formed. A first constituent channel is formed by a first channel layer 66, e.g., formed of GaN, deposited on the nucleation layer 64 (or the substrate 62), with a first barrier layer 68, e.g., formed of AlGaN, deposited on the first channel layer 66. At the heterojunction between the first channel layer 66 and the first barrier layer 68, a first 2DEG 70 is formed, which constitutes the first constituent channel of the composite-channel HEMT 60.

A second channel layer 72, e.g., formed of GaN, is deposited on the first barrier layer 68. A second barrier layer 74, e.g., formed of AlGaN, is deposited on the second channel layer 72, forming a heterojunction. As described above, a second 2DEG 76 is formed at this heterojunction, which constitutes the second constituent channel of the composite-channel HEMT 60. Similarly, a third channel layer 78, e.g., formed of GaN, is deposited on the second barrier layer 74. A third barrier layer 80, e.g., formed of AlGaN, is deposited on the third channel layer 78, forming a heterojunction. As described above, a third 2DEG 82 is formed at this heterojunction, which constitutes the third constituent channel of the composite-channel HEMT 60.

Although each of the channel layers 66, 72, 78, and each of the barrier layers 68, 74, 80, are depicted in FIG. 4 as being the same thickness, this is not a limitation of embodiments of the present invention. For example, in one embodiment, the thickness of channel layers 66, 72, 78 may increase with depth—with the channel layer 66 lying closest to the substrate 62 having the greatest thickness. In another embodiment, the thickness gradient may run the other direction, with the thinnest channel layer 66 proximate the substrate 32. Similarly, the barrier layers 69, 74, 80 may be of different thicknesses, with the thickness increasing or decreasing with layer depth, in different embodiments. The channel 66, 72, 78 and barrier 68, 74, 80 layer thicknesses may vary differently with depth—for example, the channel layers 66, 72, 78 may be formed thinner with increasing depth and the barrier layers 68, 74, 80 thicker, or vice versa. Additionally, the alloying of the barrier layers 68, 74, 80 may all be the same, or may differ, such as by depth within the stacking structure. For example, the upper barrier layer 80 may be alloyed with a different concentration of Al than the lower barrier layers 68, 74, to exhibit a greater or lesser bandgap difference as compared to its respective channel layer 78, 72, 66. In one embodiment, the thickness of barrier layers 68, 74, 80 may be in the range of 4 to 15 nm. In one embodiment, the thickness of channel layers 66, 72, 78 may be in the range of 5 to 30 nm.

The different channel 66, 72, 78 and barrier 68, 74, 80 layers may also be doped substantially similarly, or the doping concentration, or gradients, may differ as a function of the depth of the layer 66, 68, 72, 74, 78, 80 within the HEMT 60 structure. In particular, the embedded barrier layers 68, 74 may be n+ doped, e.g., with Si, to a greater degree than the uppermost barrier layer 80, to drive negative charge into their respective heterojunctions.

The n+ implant regions 90 formed beneath the source terminal 84 and drain terminal 88 extend within the semiconductor structure to at least the depth of the most deeply embedded 2DEG 70, and may optionally extend further, such as at least partially into the first channel layer 66, as shown.

FIG. 4 depicts the steps in a method 100 of fabricating a HEMT 10. A first channel layer 66 is deposited (block 102), such as onto a substrate 62 or nucleation layer 64. A first barrier layer 68 is deposited on the first channel layer 66 (block 104). The first barrier layer 68 has a higher bandgap than the first channel layer 66, whereby a first 2DEG 70 is formed in the first channel layer 66 at an interface with the first barrier layer 68. In one embodiment, the first barrier layer 68 is doped with an n-type dopant. In one embodiment, the first barrier layer 68 is also graded, with a lower concentration of alloy (e.g., 0%) at the lower surface, and a higher concentration (e.g., 22%) at the upper surface.

A second channel layer 72 is deposited over the first barrier layer 68 (block 106). A second barrier layer 74 is deposited on the second channel layer 72 (block 108). The second barrier layer 74 has a higher bandgap than the second channel layer 72, whereby a second 2DEG 76 is formed in the second channel layer 72 at an interface with the second barrier layer 74.

The method 100 produces at least a dual-channel HEMT 60. To achieve a HEMT 60 having a composite channel comprising more constituent channels, the last barrier layer 74 may be doped with an n-type dopant, and optionally graded, and one or more additional channel/barrier layer pairs 78, 80 are deposited on the last barrier layer 74. When sufficient channel/barrier layer pairs have been formed, the uppermost barrier layer (80, in the embodiment of FIG. 4)

may not be doped or graded. A passivation layer may be added (see FIG. 3), and metal contacts 84, 86, 88 are formed, as well known in the semiconductor arts.

Embodiments of the present invention present numerous advantages over HEMTs of the prior art. By forming a composite channel comprising a plurality of 2DEGs (formed by a plurality of stacked channel/barrier layer pairs), the charge density in each constituent channel of the composite channel (i.e., each 2DEG) is relatively low, while the total charge density for the composite channel is high. The high charge density allows for high gain, and operation at high power. Because the charge density in each constituent channel of the composite channel (i.e., each 2DEG) is low, the saturated electron velocity can be high, allowing for operation at high frequencies. The composite channel HEMT 10 thus achieves high gain and high power at high frequencies, providing a high efficiency transistor for high frequency applications.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A composite channel transistor, comprising:
a first channel layer;
a first barrier layer on the first channel layer, the first barrier layer having a higher bandgap than the first channel layer;
a first Two-Dimensional Electron Gas (2DEG) formed in the first channel layer at an interface with the first barrier layer; and
a second channel layer on the first barrier layer;
a second barrier layer on the second channel layer, the second barrier layer having a higher bandgap than the second channel layer; and
a second 2DEG formed in the second channel layer at an interface with the second barrier layer;
wherein a composite channel of the transistor comprises both the first and second 2DEGs; and
wherein electron charge density is shared between the first and second 2DEG such that the overall saturated electron velocity in the composite channel is greater than in a channel of a transistor having only one 2DEG formed by a channel and barrier layer having properties substantially similar to the first or second channel and barrier layers.

2. The transistor of claim 1 further comprising:
a third channel layer on the second barrier layer;
a third barrier layer on the third channel layer; and
a third 2DEG formed in the third channel layer at an interface with the third barrier layer;
wherein the composite channel of the transistor further comprises the third 2DEG.

3. The transistor of claim 2 wherein at least one of the first and second barrier layers are doped with an n-type dopant to a greater extent than the uppermost barrier layer.

4. The transistor of claim 1 wherein the channel and barrier layers comprise Group III nitride materials.

5. The transistor of claim 4 wherein at least one channel layer comprises GaN and the barrier layer on it comprises AlGaN.

6. The transistor of claim 5 wherein the concentration of Al in one or more barrier layers is graded from a lower concentration at the lower surface to a higher concentration at the upper surface.

7. The transistor of claim 6 wherein the Al gradient in the graded AlGaN layers ranges from just over 0% at the lower surface to approximately 22% at the upper surface.

8. The transistor of claim 6 wherein the concentration of Al in the uppermost barrier layer is not graded as a function of depth.

9. The transistor of claim 1 wherein the first barrier layer is doped with an n-type dopant to a greater extent than the uppermost barrier layer.

10. The transistor of claim 9 wherein the n-type dopant in the doped barrier layers is concentrated toward the upper surface of each doped barrier layer.

11. The transistor of claim 9 wherein the concentration of doping in two or more doped barrier layers is different, and wherein the deeper of the doped barrier layers have higher concentrations.

12. The transistor of claim 1 further comprising a substrate, wherein the first channel layer is on the substrate.

13. The transistor of claim 12 further comprising a nucleation layer between the substrate and the first channel layer.

14. The transistor of claim 1 wherein the composite channel of the transistor results in a higher values for charge density in the composite channel than in a channel of a transistor having only one 2DEG formed by a channel and barrier layer having properties substantially similar to the first or second channel and barrier layers.

15. The transistor of claim 1 further comprising:
source and drain terminals formed over the uppermost barrier layer; and
separate conductive regions under the source and drain terminals, the conductive regions extending at least down to the lowest 2DEG and providing conductivity between all intervening 2DEGs and the respective source and drain terminals.

16. The transistor of claim 15 wherein the conductive regions are formed by ion implantation.

17. The transistor of claim 15 further comprising:
a gate terminal formed over the uppermost barrier layer between the source and drain terminals; and
one or more field plates formed at least partially over the gate terminal and extending at least partially over the region between the gate and drain terminals.

18. The transistor of claim 1 wherein an embedded barrier layer has a greater thickness than the uppermost barrier layer.

19. The transistor of claim 1 wherein an embedded barrier layer has a thickness less than the uppermost barrier layer.

20. A method of fabricating a transistor, comprising:
depositing a first channel layer;
depositing a first barrier layer on the first channel layer, the first barrier layer having a higher bandgap than the first channel layer, whereby a first Two-Dimensional Electron Gas (2DEG) is formed in the first channel layer at an interface with the first barrier layer;
depositing a second channel layer on the first barrier layer; and
depositing a second barrier layer on the second channel layer, the second barrier layer having a higher bandgap than the second channel layer, whereby a second 2DEG is formed in the second channel layer at an interface with the second barrier layer;

wherein a composite channel of the transistor comprises both the first and second 2DEGs; and wherein electron charge density is shared between the first and second 2DEG so as to increase the overall saturated electron velocity in the composite channel;

wherein electron charge density is shared between the first and second 2DEG such that the overall saturated electron velocity in the composite channel is greater than in a channel of a transistor having only one 2DEG formed by a channel and barrier layer having properties substantially similar to the first or second channel and barrier layers.

21. The method of claim 20 further comprising:

depositing a third channel layer on the second barrier layer; and depositing a third barrier layer on the third channel layer, the third barrier layer having a higher bandgap than the third channel layer, whereby a third 2DEG is formed in the third channel layer at an interface with the third barrier layer;

wherein the composite channel of the transistor further comprises the third 2DEG.

22. The method of claim 20 wherein the channel and barrier layers comprise Group III nitride materials.

23. The method of claim 20 wherein depositing at least one channel layer comprises depositing a GaN layer and wherein depositing a barrier layer directly on it comprises depositing a AlGaN layer directly on the GaN layer.

24. The method of claim 23 wherein depositing one or more AlGaN layers comprises grading the Al from a lower concentration at the lower surface to a higher concentration at the upper surface.

25. The method of claim 24 wherein grading the Al in the graded AlGaN layers comprises depositing just over 0% Al at the lower surface to approximately 22% Al at the upper surface.

26. The method of claim 20 wherein depositing all barrier layers other than the uppermost barrier layer comprises further doping the barrier layers other than the uppermost barrier layer with an n-type dopant.

27. The method of claim 26 wherein doping the barrier layers other than the uppermost barrier layer with an n-type dopant comprises concentrating the dopant toward the upper surface of each doped barrier layer.

28. The method of claim 26 wherein doping the barrier layers other than the uppermost barrier layer with an n-type dopant comprises increasing the concentration of dopant as a function of barrier layer depth.

29. The method of claim 20 further comprising providing a substrate, wherein depositing a first channel layer comprises depositing the first channel layer on the substrate.

30. The method of claim 29 further comprising depositing a nucleation layer on the substrate and depositing the first channel layer on the nucleation layer.

31. The method of claim 20 wherein the composite channel of the transistor results in a higher values for charge density in the composite channel than in a channel of a transistor having only one 2DEG formed by a channel and barrier layer having properties substantially similar to the first or second channel and barrier layers.

32. The method of claim 20 further comprising:

forming source and drain terminals formed over the uppermost barrier layer; and forming separate conductive regions under the source and drain terminals, the conductive regions extending at least down to the lowest 2DEG and providing conductivity between all intervening 2DEGs and the respective source and drain terminals.

33. The method of claim 32 wherein forming separate conductive regions comprises forming the conductive regions by ion implantation.

34. The transistor of claim 33, wherein the ion implantation is performed with an n-type dopant.

35. The method of claim 32 further comprising:

forming a gate terminal formed over the uppermost barrier layer between the source and drain terminals; and forming one or more field plates formed at least partially over the gate terminal and extending at least partially over the region between the gate and drain terminals.

36. A composite channel transistor, comprising:

a first channel layer comprising GaN;

a first barrier layer on the first channel layer, the first barrier layer comprising AlGaN;

a first Two-Dimensional Electron Gas (2DEG) formed in the first channel layer at an interface with the first barrier layer; and a second channel layer comprising GaN;

a second barrier layer on the second channel layer, the second barrier layer comprising AlGaN; and a second 2DEG formed in the second channel layer at an interface with the second barrier layer;

wherein the concentration of Al in an embedded barrier layer is graded from a lower concentration at the lower surface to a higher concentration at the upper surface; and wherein the concentration of Al in the uppermost barrier layer is not graded as a function of depth.

* * * * *